United States Patent [19]
Johnson et al.

[11] 3,967,139
[45] June 29, 1976

[54] APPARATUS FOR ENHANCING OUTPUT CHARACTERISTICS OF VOLTAGE DRIVER CIRCUITS

[75] Inventors: Robert B. Johnson, Billerica; Paul S. Feldman, Waltham; Edwin P. Fisher, North Abington, all of Mass.

[73] Assignee: Honeywell Information Systems, Inc., Waltham, Mass.

[22] Filed: Dec. 2, 1974

[21] Appl. No.: 528,599

[52] U.S. Cl. ............................. 307/270; 307/215; 307/254; 307/DIG. 1
[51] Int. Cl.² ................................. H03K 17/00
[58] Field of Search ...... 307/254, 215, 270, DIG. 1, 307/253

[56] References Cited
UNITED STATES PATENTS

| | | | |
|---|---|---|---|
| 3,581,107 | 5/1971 | Nielsen | 307/254 |
| 3,755,690 | 8/1973 | Smith | 307/DIG. 1 |
| 3,852,646 | 12/1974 | Mason | 307/270 |

*Primary Examiner*—Stanley D. Miller, Jr.
*Assistant Examiner*—B. P. Davis
*Attorney, Agent, or Firm*—D. A. Frank; W. W. Holloway, Jr.

[57] ABSTRACT

An apparatus is disclosed which comprises an improved voltage driver circuit. Commonly available voltage driver circuits are deficient for driving n-channel MOS RAMs due to insufficient peak voltage and extended rise time. The apparatus, without requiring an additional voltage power supply or modifications to the memory system environment, effectively increases an internal drive voltage which results in the desired performance characteristics for driver circuits.

3 Claims, 4 Drawing Figures

APPARATUS FOR ENHANCING OUTPUT CHARACTERISTICS OF VOLTAGE DRIVER CIRCUITS

BACKGROUND OF THE INVENTION

1. Field of the Invention

This invention relates generally to voltage driver circuits and, in particular, to an improved voltage driver circuit for driving n-channel MOS RAMs in a data processing system.

2. Description of the Prior Art

In recent years, data processing systems have been evolving towards more efficient and more compact units. This trend has been paralleled by the development of systems which operate at ever-increasing speeds. Typifying these trends is the development and success of mini-computers.

An essential component of a data processing system is the memory unit. Random access memories (RAMs) have recently evolved from p-channel devices to n-channel metal-oxide semiconductor field effect transistors (MOSFETs). This development has numerous advantages. Where the typical p-channel device, such as an Intel 1103, would contain 1,024 (or approximately 1K) memory locations per bit, an n-channel MOSFET, such as a TMS 4030, contains 4,096 (or approximately 4K) memory locations per bit. In addition, the n-channel device is capable of operating at faster speeds. Both the increased density and speed of the n-channel devices make them clearly more desirable for modern data processing and mini-computer usage. Unfortunately, the development of improved RAMs has significantly preceded the development of appropriate driver circuits for operating these RAMs.

P-channel RAMs typically require operation in a memory system environment which has available three positive power supplies or three system levels of power (5V, 12V and 15-20V). N-channel systems typically have only two positive power supplies available (5V and 12V and a third supply at −3V to −5V). In addition, n-channel RAMs are particularly sensitive to input voltage levels and rise times of clock signals coupled to the chip enable input terminals.

Commonly used for driving the RAMs is a standard off-the-shelf quad TTL to MOS clock driver circuit. (Such a circuit is commonly produced by integrated circuit manufacturers, such as the SN75365 by Texas Instruments.) However, the circuit was originally designed for driving p-channel memory devices. Its use in an n-channel environment presents several difficulties. If only the two commonly available (5 volt and 12 volt) system-level power supplies are used, the peak voltage level and rise time parameters will be unacceptable for properly driving n-channel RAMs. Prior art remedies to this deficiency required supplying a third high-level voltage (greater than 12 volts) to the driver circuit. This, however, is a costly solution, in terms of dollars as well as in space and weight.

Another method of remedying this problem is to increase the high level (12 volt) system voltage presently available in the RAM environment. The increased voltage may then be stepped down to 12 volts, thereby effectively providing three voltage levels for use by the driver circuit. However, increasing the voltage necessitates both alteration of the system as well as increased power requirements.

OBJECTS OF THE INVENTION

It is an object of the present invention, therefore, to provide an improved voltage driver circuit.

It is another object of the present invention to provide an improved voltage driver circuit which requires only 5 volt and 12 volt system level voltages for its proper operation.

It is another object of the present invention to provide an improved apparatus which utilizes available system level power supplies, said apparatus providing an output voltage signal within the desired parameters for a driving n-channel MOS RAM.

It is still yet another object of the present invention to provide an apparatus for driving n-channel RAMs which does not require alteration of the system-level voltages within the RAM environment for proper operation of the memory system.

Other objects and benefits will become apparent from the following description of the preferred embodiment of the invention when read in conjunction with the drawings contained herewith.

SUMMARY OF THE INVENTION

Voltage clock driver circuits are readily available to computer manufacturers from conventional supply sources. However, such circuits do not provide output signals within acceptable parameters for driving n-channel RAMs. This is due to the lack of a third high-level (15-18 volt) power supply within the RAM environment. The present invention improves upon available voltage driver circuits so as to provide a new apparatus which generates signals within the desired parameters. An available system voltage (12V) is supplied to a first power terminal of the driver circuit. An inductor is connected from said first power terminal to a second power terminal of the circuit. The inductor causes the second power terminal to reach a significantly higher voltage level within the desired time parameters. In this manner, the output voltage of the driver circuit achieves the desired characteristics.

DESCRIPTION OF THE PREFERRED EMBODIMENT

Figure 1:
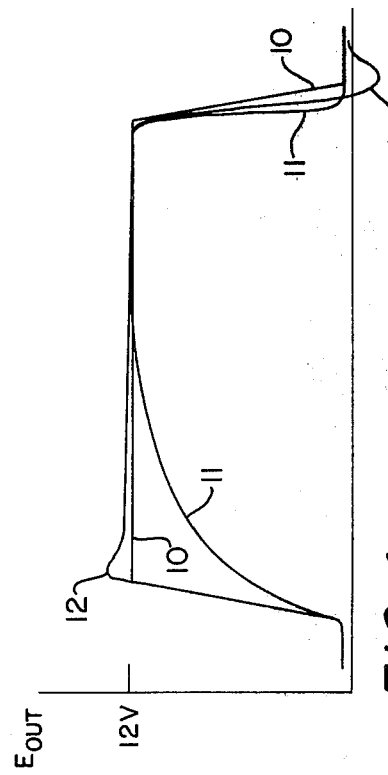
FIG. 1 is a diagram of output voltages from voltage driver circuits.

Referring now to FIG. 1, output voltage $E_{out}$ of a frequency driver circuit is plotted against time under various conditions. (The time scale is in nano-seconds). Curve 10 shows an ideal output voltage for driving n-channel RAMs. It rises relatively rapidly (within 20 nano-seconds) and achieves a peak voltage (12 volts) within a short, acceptable time frame. Curve 11 illustrates the output voltage which is obtained from a prior art driver circuit, such as an SN75365, when a 12-volt power supply is attached to both the $V_2$ and $V_3$ terminals. Rise time to achieve peak voltage (approximately 100 nano-seconds to reach 90% of peak voltage) is not within critical limits for proper driving of n-channel RAMs.

Figure 2:
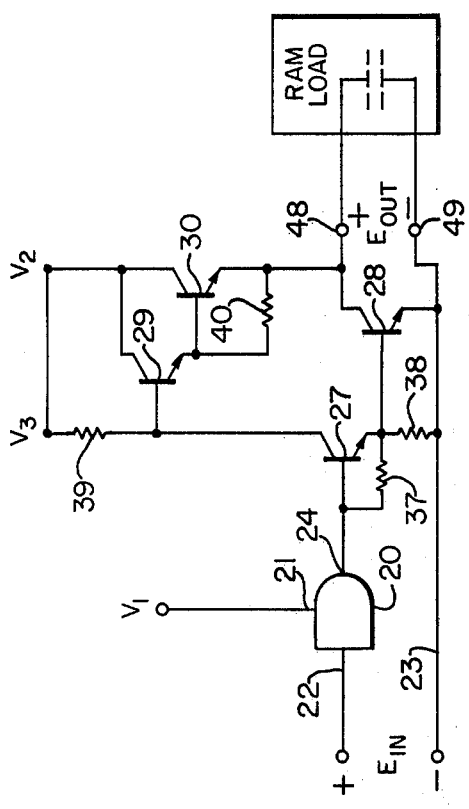
FIG. 2 is a schematic diagram of a generalized prior art voltage driver circuit.

Referring now to FIG. 2, a generalized prior art voltage circuit is shown. (Such a prior art circuit is commonly available on an integrated circuit (IC) chip supplied by conventional manufacturers).

Gate 20 may be an AND, NAND, OR, or NOR gate which may be comprised of an electronic circuit configuration of any of the following types: DTL, TTL, ECL or CML. Gate 20 is driven by the low-level system voltage $V_1$ (5V) applied through power terminal 21. Gate 20 has input terminal 22 for input signal $E_{IN}$. $E_{IN}$ is a voltage signal which is measured as the potential difference between terminal 22 and common ground 23. Gate 20 also has output terminal 24 which is coupled to the base of transistor 27 and, by resistor 37, to the emitter of transistor 27. The emitter of transistor 27 is coupled to the base of transistor 28 and, by resistor 38, to the common ground 23. The emitter of transistor 28 is connected to the common ground 23 and may also be considered as output terminal 49. The collector of transistor 28 is connected to output terminal 48. The potential difference between output terminals 48, 49 is $E_{out}$.

The "upper" stage of the circuit, conventionally referred to as a "totem pole" stage, is comprised of the following components. Input voltage terminal $V_3$ is coupled by resistor 39 to both the base of transistor 29 and the collector of transistor 27. Input voltage terminal $V_2$ is also coupled to the collectors of transistors 29 and 30. The emitter of transistor 29 is coupled to the base of transistor 30. Resistor 40 couples the emitter of transistor 29 to the emitter of transistor 30. The emitter of transistor 30 is coupled to the collector of transistor 28. The high level system voltage (of approximately 12 volts) is attached to the $V_2$ terminal. (The RAM load, which may be comprised of TMS 4030 RAMs, is represented as an effective capacitive load. Typically a plurality of RAMs are connected in parallel by a main bus to a voltage driver circuit and have the loading effect of appearing as a 390 picoFarad load to the voltage driver circuit.) The output voltage $E_{out}$ from the prior art circuit is as shown in Curve 11 in FIG. 1, which is deficient for driving n-channel RAM loads. The reason for achieving output Curve 11 lies in the operation of the prior art circuit.

Referring again to FIG. 2, when Gate 20 is on, current flows through into the base of "phase splitter" transistor 27 and saturates it, which causes transistor 27 to look like a closed switch. This in turn causes current to flow through the emitter of transistor 27 into the base of transistor 28 and similarly saturates transistor 28. This corresponds to a closed state for "switch" 28 with its collector to emitter voltage very small. This is equivalent to the low output voltage volt for the voltage driver circuit. A low output has a maximum of 0.3 volts.

When Gate 20 is off, transistors 27 and 28 are similarly off. This corresponds to the "on" state of the circuit and must be described in conjunction with the upper "totem pole" stage of the circuit. With phase-splitter transistor 27 off, current flows into the base of transistor 29, causing it to be on. This in turn causes transistor 30 to be on, and the output voltage $E_{out}$ to be high. However, $V_3$ of 12 volts is not high enough to saturate transistors 29 and 30. In particular, the collector to emitter voltage of transistor 30 is approximately 1 volt. Consequently, although the output voltage $E_{out}$ is high, it is approximately one volt lower than $V_2$ (or approximately 11.0 volts). To remedy this problem requires a higher $V_3$ which would cause a complete saturation of transistor 30 with a collector to emitter voltage of only a maximum of about 0.3 volts.

Figure 3:
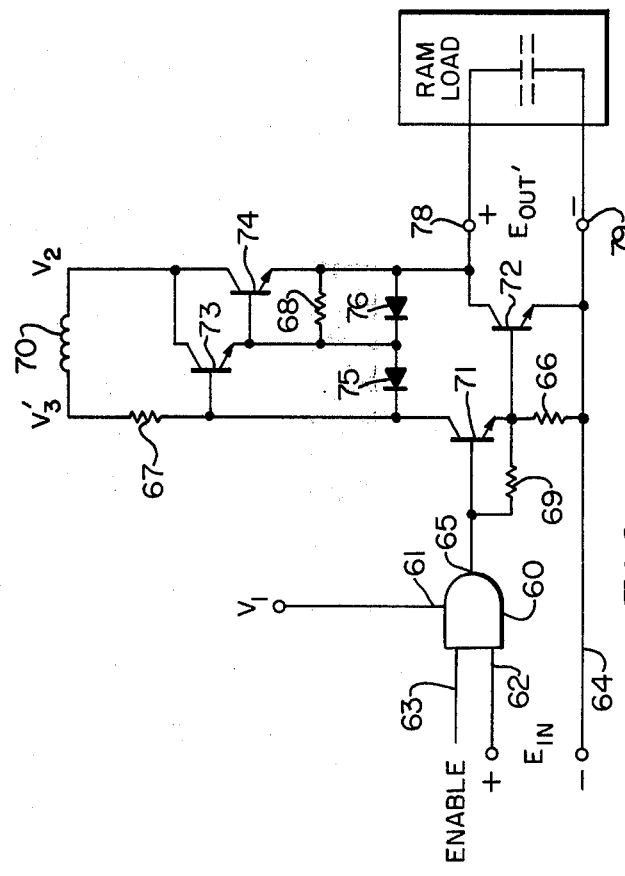
FIG. 3 is a schematic diagram of a voltage driver circuit according to the invention.

Referring now to FIG. 3, a circuit according to the invention is shown connected to an effective capacitive load, which is typical of how a plurality of RAMs connected in parallel appear to their voltage driver circuit. Gate 60 may be an AND, NAND, or NOR gate which may be comprised of an electronic circuit configuration of any of the following types: DTL, TTL, ECL, or CML. Gate 60 is driven by the low-level system voltage $V_1$, (5V) applied through power terminal 61. Gate 60 may have a plurality of input terminals. One of these, terminal 62, is for input signal $E_{IN}$ which is considered the primary drive signal for Gate 60. $E_{IN}$ is a voltage signal which is measured as the potential difference between terminal 62 and common ground 64. There may be additional input signals which are considered enabling signals for gate 60. In FIG. 3 only a single enabling signal terminal 63 is shown. Gate 60 also has output terminal 65 which is coupled to the base of transistor 71. The emitter of transistor 71 is coupled by resistor 66 to common ground 64 and by resistor 69 to its base. The emitter of transistor 71 is also coupled to the base of transistor 72. The collector of transistor 72 is coupled to the collector of transistor 71 by two forward-biased diodes 75, 76 connected in series between said collectors. The emitter of transistor 72 is coupled to common ground 64 and is also considered output terminal 79. The collector of transistor 72 is coupled to output terminal 78. The potential difference between output terminals 78, 79 is $E_{out'}$.

The "totem pole" stage of the circuit is designed as follows. A $V_{3'}$ point is coupled by resistor 67 to the base of transistor 73 and to the collector of transistor 71. A $V_2$ terminal is coupled to the collectors of transistors 73 and 74. The emitter of transistor 73 is coupled to the base of transistor 74 and, by resistor 68, to the emitter of transistor 74. The emitter of transistor 73 is also coupled to a point between diodes 75, 76. The emitter of transistor 74 is also coupled to the collector of transistor 72. Finally, an inductor 70 couples the $V_2$ terminal to the $V_{3'}$ point.

(Additionally, a diode may be connected from the emitter to the collector of transistor 74. In this manner, the circuit shown in FIG. 3, with the exception of inductor 70, corresponds to a conventional driver circuit such as a SN75365 by Texas Instruments.)

For discrete circuits, transistors 71 to 74 may have beta-values of 50, such as a 2N2270. For IC circuits, transistors 71 to 74 may have beta-values of 10. Diodes 75, 76 may be any small signal diode, such as an 1N903. Resistors 66, 67, 68, 69 may have the following OHM values respectively: 250, 6K, 250, 200. All of these above values are within a range of workable values, as one ordinarily skilled in the art will readily recognize and substitution of alternative values or equivalent components is foreseen. The above-mentioned values are given as suggested values and in no way limit the scope of the invention.

Operation of the circuit according to the invention is as follows. The high-level (12-volt) system voltage is coupled to the $V_2$ terminal. No power source is coupled to the $V_3$ point (or terminal). The operating characteristics of the output voltage $E_{out'}$ are shown as Curve 12 in FIG. 1. $E_{out}$ in Curve 12 exceeds the required minimum voltage of 12 volts for a short duration, but this is of no consequence. The critical factor is achieving a minimum E$_{out}$ of 12 volts. The key to the difference between output Curves 11 and 12 of FIG. 1 lies in the operation of inductor 70 of FIG. 3.

Empirical testing of voltage driver circuits, such as those shown in FIGS. 2 and 3, has revealed that to obtain a desirable E$_{out}$ or E$_{out'}$ curve, the voltage at the V$_3$ or V$_{3'}$ point must be at least 15 volts at the time of switching of phase-splitter transistor 27 of FIG. 2 or phase-splitter transistor 71 of FIG. 3, from an on to an off state. An inductor operates on the basis of changing current. In this manner, it is a dynamic element within the circuit configuration only when the current passing through it changes, either from high to low, or from low to high. Therefore, in the circuit shown in FIG. 3, inductor 70 is of importance only when transistor 71 changes state, which is precisely the time that additional V$_{3'}$ voltage is needed. The effect of inductor 70 is a coupling of the V$_{3'}$ voltage to the changing of the dynamic condition of transistor 71. When transistor 71 goes off, V$_{3'}$ receives a "kick". This effect diminishes soon after the change. Nonetheless, this kick is sufficient to obtain an output voltage corresponding to Curve 12 of FIG. 1. (The corresponding "negative kick" to V$_{3'}$ is of no consequence to the operation of the circuit).

Figure 4:
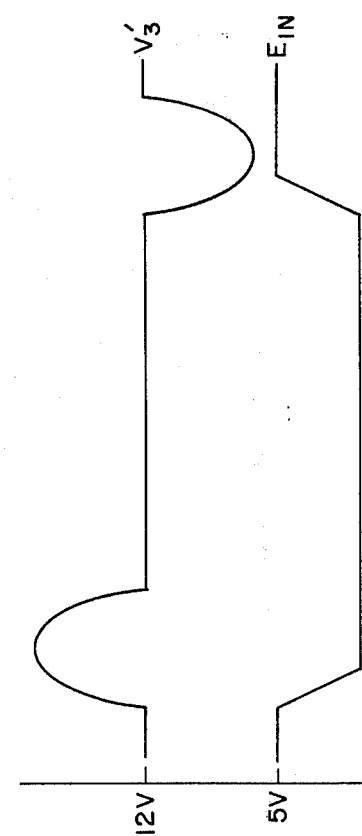
FIG. 4 is a diagram of the effective $V_3$ voltage in a voltage driver circuit according to the invention.

Referring now to FIG. 4, E$_{IN}$ and V$_{3'}$ voltages of FIG. 3 are plotted in parallel. It should be noted that E$_{IN}$ can be considered an enabling signal for gate 60 and the controlling signal for the operation of the driver circuits. As can be seen starting with E$_{IN}$ in a high, steady state of 5 volts, V$_{3'}$ is equal to 12 volts. When E$_{IN}$ changes to a low state, V$_{3'}$ is "kicked" by approximately 6 volts and then returns to 12 volts. (The pulse width of E$_{IN}$ is assumed to be greater than 250 nano-seconds). Referring once again to FIG. 1, Curve 12 shows the resulting output voltage E$_{out}$. In Curve 12, E$_{out}$ achieves the required minimum output voltage within a desired time parameter.

The circuit according to the invention is used for TTL (or DTL, ECL or CML) to MOS conversion. This is an important requirement for driving RAMs which appear as effective capacitive loads to the voltage driver circuits. It can be seen that the invention can be embodied by a relatively simple modification to a standard off-the-shelf voltage driver circuit which has a third power terminal externally available. An SN75365 made by Texas Instruments contains four such voltage driver circuits on a single IC chip.

Terminals for receiving input drive voltages V$_1$, V$_2$, and V$_3$ are externally available on the chip, and they are commonly connected to a plurality of driver circuits internally within the driver chip by the manufacturer. (Similarly, all but one of the input enabling terminals for each of the four circuits are commonly connected, and there is also a common ground for the four circuits.) By externally coupling an appropriate inductor between the V$_2$ and V$_3$ terminals, a plurality (which in the above-mentioned chip is four) of voltage driver circuits with desirable output characteristics is obtained. It should be noted that in this manner, only one inductor is required for modification of all driver circuits contained in any one IC chip. The suggested range of inductive values for the inductor is between 36 and 100 microhenries for a pulse width of 500 nanoseconds and repetition rates of 1.0 microhenries or less. This modification is both simple to achieve and inexpensive. It is believed to have widespread application within the computer industry due to the trending towards n-channel MOS RAMs.

What is claimed is:

1. Driver circuit comprising:
first means for receiving a high-level drive voltage signal;
gating means for receiving a plurality of low-level input signals and for generating a logic signal corresponding to a logical function of said plurality input signals; and
second means coupled to said gating means and responsive to a change in said logic signal for generating a high-level output signal, said second means including a phase splitting transistor with its base connected to receive said logic signal and inductive means coupled between said first means and the collector of said phase splitting transistor for converting said high-level drive voltage signal to an internal signal which includes higher level voltage segments which appear substantially time coincidentally with a change in said logic signal and are at least 3 volts different than said high-level drive voltage signal.

2. A voltage driver circuit comprising:
first means for receiving a high-level drive voltage signal;
second means for receiving a plurality of low-level input signals; and
third means coupled to said first means and responsive to said second means for generating a high-level output signal, said third means including inductive means for converting said high-level drive voltage signal into an internal signal which includes higher level voltage segments which are at least 3 volts higher than said high-level drive voltage signal, said inductive means having a value between 36 and 100 microhenries.

3. A circuit comprising:
first means for receiving a high-level input signal;
second means for receiving and logically operating on a plurality of low-level signals and for generating an enabling signal;
inductive means coupled to said first means for boosting said high-level input signal substantially timed coincidentally with the changing of said enabling signal; and
third means coupled to said first means and comprising:
a phase splitting transistor with its base connected to receive said enabling signal and its collector connected to said inductive means, and
switching means responsive to said boosted signal for transmitting said high-level input signal as a high-level output signal.

* * * * *